US010845933B2

(12) United States Patent
Rhe et al.

(10) Patent No.: US 10,845,933 B2
(45) Date of Patent: Nov. 24, 2020

(54) DISPLAY DEVICE INCLUDING TOUCH ELECTRODE AND METHOD FOR MANUFACTURING THE SAME

(71) Applicant: LG Display Co., Ltd., Seoul (KR)

(72) Inventors: Ruda Rhe, Paju-si (KR); Yangsik Lee, Paju-si (KR); KwangJo Hwang, Paju-si (KR); DeukSu Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 73 days.

(21) Appl. No.: 15/814,111

(22) Filed: Nov. 15, 2017

(65) Prior Publication Data

US 2018/0348918 A1   Dec. 6, 2018

(30) Foreign Application Priority Data

Jun. 1, 2017 (KR) .................. 10-2017-0068424

(51) Int. Cl.
   *G06F 3/041* (2006.01)
   *G06F 3/047* (2006.01)
   (Continued)

(52) U.S. Cl.
   CPC .............. *G06F 3/047* (2013.01); *G06F 3/044* (2013.01); *G06F 3/0412* (2013.01);
   (Continued)

(58) Field of Classification Search
   CPC ...... G06F 3/047; G06F 3/0412; G06F 3/0416; G06F 2203/04102; G06F 2203/04103;
   (Continued)

(56) References Cited

U.S. PATENT DOCUMENTS 9,082,667 B2   7/2015   Youn et al.
9,203,040 B2   12/2015   Yasuda
(Continued)

FOREIGN PATENT DOCUMENTS

EP   2513764 A2   10/2012
JP   2013-089647 A   5/2013
(Continued)

OTHER PUBLICATIONS

First Office Action, Japanese Patent Application No. 2017-248950, dated Nov. 27, 2018, 7 pages.
(Continued)

*Primary Examiner* — Duc Q Dinh
(74) *Attorney, Agent, or Firm* — Fenwick & West LLP

(57) ABSTRACT

A display device includes: a display region formed in a first region on a substrate and including a plurality of pixels arranged therein; a touch electrode disposed on the display region and configured to sense a touch; and a non-display region disposed in a second region on the substrate. The non-display region includes a first pad portion, a second pad portion, a link portion, and a wiring portion in which a wiring is disposed so as to interconnect the first and second pad portions and the link portion. The wiring portion is disposed in a bending region where the substrate is bent, and the wiring includes a first wiring and a second wiring formed above the first wiring and having at least one point connected to the first wiring in the bending region.

21 Claims, 17 Drawing Sheets

(51) Int. Cl.
*G06F 3/044* (2006.01)
*H01L 27/32* (2006.01)
*H01L 51/52* (2006.01)

(52) U.S. Cl.
CPC .......... *G06F 3/0416* (2013.01); *H01L 27/323* (2013.01); *H01L 51/5206* (2013.01); *H01L 51/5221* (2013.01); *G06F 2203/04112* (2013.01)

(58) Field of Classification Search
CPC ......... G06F 1/1616; G06F 2203/04111; G06F 1/1652; G06F 3/0418; G06F 1/1618; G06F 1/1637; G06F 3/04164; G06F 3/0443; G06F 3/0445; G06F 3/0446; G06F 1/1641; G06F 2203/04105; H01L 27/3276; H01L 51/0097; H01L 2251/5338; H01L 27/323; H01L 27/3262; H01L 27/1244; H01L 2251/5392; H01L 27/3288; H01L 27/3297; H01L 51/5012; H01L 51/5064; H01L 51/5203; H01L 51/5221; G02F 1/133305; G02F 1/1333; G09G 2380/02; G09G 2300/0426
See application file for complete search history.

(56) References Cited

U.S. PATENT DOCUMENTS

| | | | |
|---|---|---|---|
| 9,293,485 B2 | 3/2016 | Youn et al. | |
| 9,401,486 B2 | 7/2016 | Yasuda | |
| 9,543,533 B2 | 1/2017 | Yamazaki et al. | |
| 10,096,669 B2 | 10/2018 | Yamazaki et al. | |
| 2014/0097408 A1 | 4/2014 | Kim et al. | |
| 2014/0239286 A1 | 8/2014 | Yasuda | |
| 2014/0254111 A1 | 9/2014 | Yamazaki et al. | |
| 2014/0353670 A1 | 12/2014 | Youn et al. | |
| 2015/0287750 A1 | 10/2015 | Youn et al. | |
| 2016/0085125 A1 | 3/2016 | Park et al. | |
| 2016/0087231 A1 | 3/2016 | Yasuda | |
| 2016/0172427 A1* | 6/2016 | Lee | H01L 27/3276 257/40 |
| 2016/0179229 A1 | 6/2016 | Ahn | |
| 2016/0268546 A1 | 9/2016 | Lee | |
| 2017/0010720 A1 | 1/2017 | Nakayama | |
| 2017/0062760 A1 | 3/2017 | Kim | |
| 2017/0077211 A1 | 3/2017 | Yamazaki et al. | |
| 2017/0090661 A1 | 3/2017 | Kim et al. | |
| 2017/0262109 A1* | 9/2017 | Choi | G06F 3/0412 |
| 2017/0277288 A1* | 9/2017 | Choi | G06F 3/041 |
| 2017/0278918 A1* | 9/2017 | Jeon | H01L 27/323 |
| 2017/0338296 A1 | 11/2017 | Yamazaki et al. | |
| 2018/0348918 A1 | 12/2018 | Rhe et al. | |

FOREIGN PATENT DOCUMENTS

| | | |
|---|---|---|
| JP | 2014-197181 A | 10/2014 |
| JP | 2014-232300 A | 12/2014 |
| JP | 2018-205687 A | 12/2018 |
| KR | 10-1740192 B1 | 5/2017 |
| WO | WO 2016/057231 A1 | 4/2016 |

OTHER PUBLICATIONS

Office Action (with English concise explanation of relevance), Japanese Patent Application No. 2019-125067, dated Aug. 27, 2020, 8 pages.

* cited by examiner

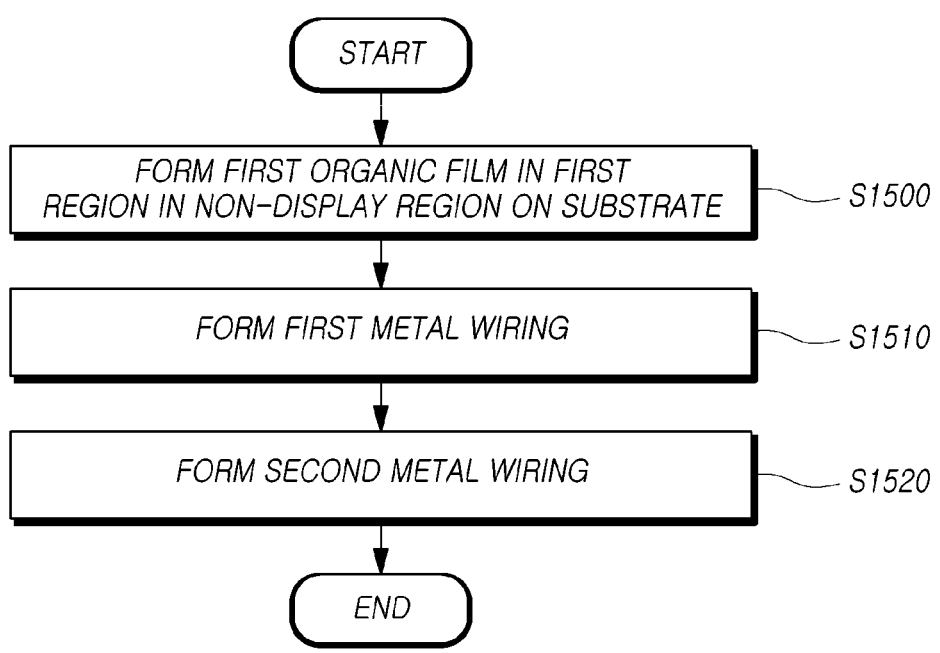

DISPLAY DEVICE INCLUDING TOUCH ELECTRODE AND METHOD FOR MANUFACTURING THE SAME

CROSS REFERENCE TO RELATED APPLICATION

This application claims priority from Korean Patent Application No. 10-2017-0068424, filed on Jun. 1, 2017, which is hereby incorporated by reference for all purposes as if fully set forth herein.

BACKGROUND

1. Field of the Disclosure

One or more embodiments disclosed herein relate to a display device including a touch electrode and a method for manufacturing the display device.

2. Description of the Prior Art

As the information-oriented society has been developed, requests for various types of display devices for displaying images have increased, and various kinds of display devices, such as a Liquid Crystal Display (LCD) device, a plasma display device, and an Organic Light Emitting Display (OLED) device, have been utilized.

In addition, a display device is capable of being operated by receiving a user's command through various input devices, such as a keyboard or a mouse. There has been developed a touch panel as an input device for a display device, in which the touch panel allows a user's command to be intuitively and conveniently input by touching the screen of the display device. The touch panel may be disposed on the screen of the display device, and the display device may receive the input of a user's command when the user touches a specific point on the screen of the display device.

A narrow bezel tends to be adopted in such a display device in order to improve an aesthetically pleasing appearance and to implement the display device in a smaller size. For this purpose, the width of a bezel portion may be reduced by bending a substrate and positioning a non-display region on the bottom surface of a display region. In the non-display region, pad portions or the like are disposed, so that signals are input to the display device via the pad portions. However, when the substrate is bent in this manner, a problem may arise in that the wiring disposed on the substrate may be cut off. In order to solve the problem of the wiring being cut off, the wiring may be implemented to have a widened width. However, when the width of the wiring is widened, it may be very difficult to apply the wiring for a high-resolution use.

SUMMARY

At least one embodiment disclosed herein provide a display device, which includes a touch electrode and is capable of preventing a wiring from being cut off by bending for obtaining a narrow bezel, and provide a method of manufacturing the display device.

Further, At least one embodiment disclosed herein provide a display device, which includes a touch electrode and is applicable to a high-resolution use, and provide a method of manufacturing the display device.

At least one embodiment disclosed herein provides a display device that includes: a display region formed in a first region on a substrate and including a plurality of pixels arranged therein; a touch electrode disposed on the display region and configured to sense a touch; and a non-display region disposed in a second region on the substrate. The non-display region includes a first pad portion configured to supply a signal corresponding to the plurality of pixels, a second pad portion configured to supply a signal corresponding to the touch electrode, a link portion configured to transmit signals received from the first pad portion and the second pad portion to the display region and the touch electrode, respectively, and a wiring portion in which a wiring is disposed so as to interconnect the first and second pad portions and the link portion. The wiring portion is disposed in a bending region where the substrate is bent, and the wiring includes a first wiring and a second wiring formed above the first wiring and having at least one point connected to the first wiring in the bending region.

At least one embodiment disclosed herein provides a display device that includes: a substrate divided into a display region and a non-display region; a first organic film disposed on one region in the non-display region; a first wiring formed in a predetermined pattern on the substrate on which the first organic film is disposed; a second organic film formed above a first metal layer and having a via hole formed therein to expose the first metal layer to a portion above the first organic film; and a second wiring formed in a predetermined pattern above the first wiring and connected to the first wiring at one or more points above the first organic film, which corresponds to the via hole.

At least one embodiment disclosed herein provides a method for manufacturing a display device. The method includes: forming a first organic film on a substrate; depositing and patterning a first wiring above the first organic film; forming a second organic film by depositing the second organic film on the first wiring and forming at least one via hole in the second organic film so as to cause the first wiring to be exposed to an upper side of the first organic film; and depositing and patterning a second wiring above the second organic film and causing the second wiring to be connected to the first wiring through the via hole.

According to at least one embodiment disclosed herein, it is possible to provide a display device, which includes a touch electrode and is capable of preventing a wiring from being cut off by bending a substrate for a narrow bezel, and to provide a method of manufacturing the display device.

According to at least one embodiment disclosed herein, it is possible to provide a display device, which includes a touch electrode and is applicable to a high-resolution use, and to provide a method of manufacturing the display device.

At least one embodiment disclosed herein includes a display device. The display device comprises a display region that comprises a plurality of pixels on a substrate and a touch electrode configured to sense a touch. A non-display region is separate from the display region. The non-display region comprises a bending region where the substrate is bent and wiring to carry a signal corresponding to the plurality of pixels or corresponding to the touch electrode. The wiring includes first wiring and second wiring above the first wiring in the bending region and being electrically connected in the bending region to the first wiring.

In at least one embodiment, the non-display region comprises a pad portion to receive the signal corresponding to the plurality of pixels or corresponding to the touch electrode, a link portion to transmit the signal to the plurality of pixels or to the touch electrode, and a wiring portion] in the bending region and interconnecting the pad portion and the link portion, the wiring being in the wiring portion.

In at least one embodiment, the signal is a signal corresponding to the plurality of pixels, and the first wiring is electrically connected to the plurality of pixels.

In at least one embodiment, the signal is a signal corresponding to the touch electrode, and the second wiring is electrically connected to the touch electrode.

In at least one embodiment, the bending region comprises an organic film disposed on the first wiring, wherein the second wiring is disposed on the organic film, and wherein the second wiring is electrically connected to the first wiring through a hole in the organic film.

In at least one embodiment, the bending region includes another organic film disposed above the substrate, wherein the first wiring is disposed above the another organic film.

In at least one embodiment, the second wiring is electrically connected in the bending region to the first wiring at a plurality of spaced apart locations. In at least one embodiment, the display device comprises a plurality of via holes at the spaced apart locations and the second wiring is electrically connected to the first wiring through the via holes.

In at least one embodiment, the second wiring includes a first metal layer and an insulating film disposed on the first metal layer. In at least one embodiment, the second wiring further includes a second metal layer disposed above the insulating film.

In at least one embodiment, at least one of the first wiring and the second wiring has a ring-shaped pattern in the bending region.

In at least one embodiment, the display region comprises a cathode corresponding to one or more organic light emitting diodes (OLEDs), and an encapsulation layer on the cathode, wherein the touch electrode is disposed on the encapsulation layer.

In at least one embodiment, a display device comprises a substrate divided into a display region and a non-display region, a first organic film disposed in the non-display region, a first wiring in a predetermined pattern on the first organic film in the non-display region, a second organic film above the first wiring, a via hole in the second organic film exposing a portion of the first wiring, and a second wiring in the predetermined pattern above the first wiring and electrically connected to the first wiring at one or more locations, at least one of the locations corresponding to the via hole.

In at least one embodiment, the display device further comprises a cathode layer corresponding to one or more organic light emitting diodes (OLEDs) on the substrate in the display region, an encapsulation layer disposed on cathode layer; and a touch electrode on the encapsulation layer, wherein the second wiring and the touch electrode are in a same metal layer.

In at least one embodiment, the second wiring includes a first metal layer and an insulating film disposed on the first metal layer. In at least one embodiment, the second wiring further includes a second metal layer disposed above the insulating film.

In at least one embodiment, the pre-determined pattern is a ring-shaped pattern.

In at least one embodiment, a display device, comprises a substrate, a first organic film on the substrate, the first organic film having a first portion located in a display area and a second portion located in a non-display area, an opening in the first organic film located between the first portion and the second portion of the first organic film, and first wiring to carry a signal to the display area, the first wiring extending over the second portion of the first organic film in the non-display area and also extending over the opening in the first organic film.

In at least one embodiment, the display device further comprises a second organic film on the first wiring, and second wiring on the second organic film that is electrically connected to the first wiring in the non-display area.

In at least one embodiment, the second wiring is electrically connected to the first wiring through holes in the second organic film.

BRIEF DESCRIPTION OF THE DRAWINGS

The above and other objects, features and advantages of the disclosure will be more apparent from the following detailed description taken in conjunction with the accompanying drawings, in which:

FIG. 17 is a flowchart illustrating a method of manufacturing a display device according to the disclosure.

DETAILED DESCRIPTION OF THE EXEMPLARY EMBODIMENTS

Figure 1:
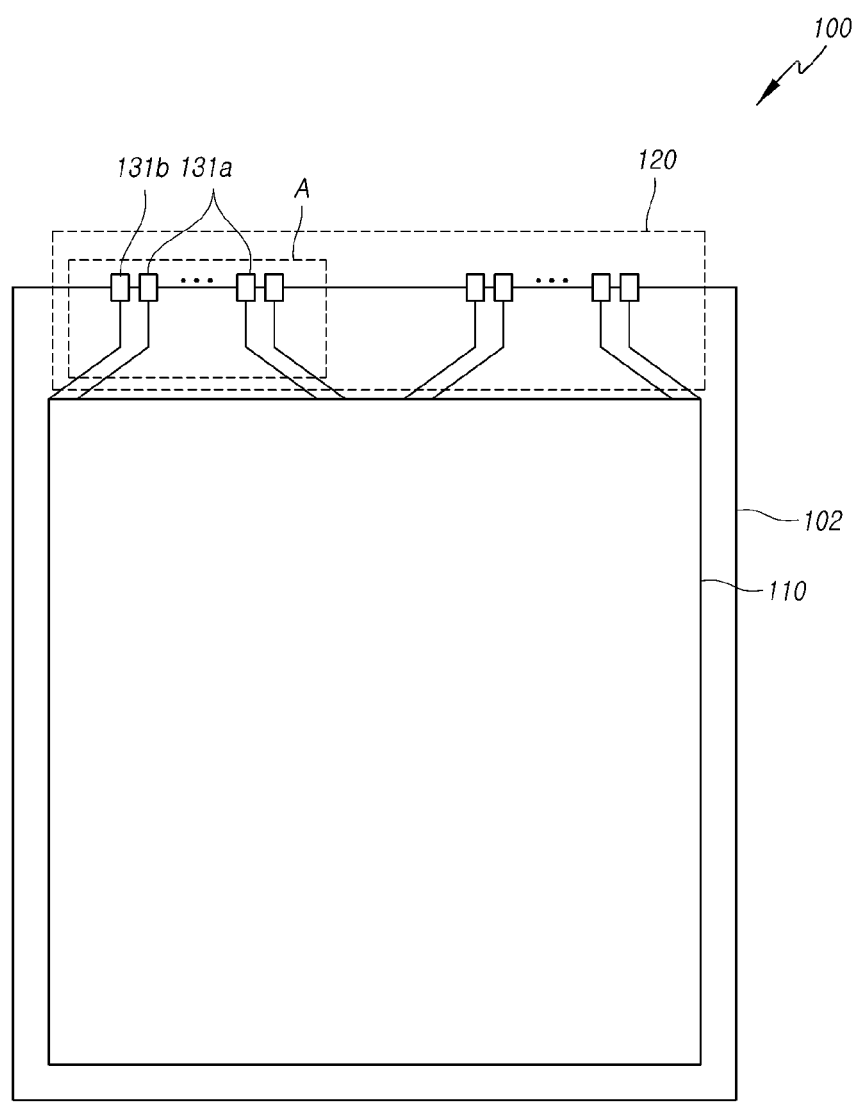
FIG. 1 is a plan view illustrating an embodiment of a display device according to the disclosure.

Hereinafter, some embodiments of the disclosure will be described in detail with reference to the accompanying illustrative drawings. In designating elements of the drawings by reference numerals, the same elements will be designated by the same reference numerals although they are shown in different drawings. Further, in the following description of the disclosure, a detailed description of known functions and configurations incorporated herein will be omitted when it may make the subject matter of the disclosure rather unclear.

In addition, terms, such as first, second, A, B, (a), (b) or the like may be used herein when describing components of the disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element. Additionally, when an element is "on" or "above" another element, the two elements can be in direct contact or there can be one or more intermediate elements between the two elements.

FIG. 1 is a plan view illustrating an embodiment of a display device according to the disclosure.

Referring to FIG. 1, a display device 100 may include a display region 110 formed in a first region on a substrate 102 and having a plurality of pixels (not illustrated) disposed therein, a touch electrode (not illustrated) disposed on the display region 110 and configured to sense a touch, and a non-display region 120 disposed in a second region on the substrate 102.

The substrate 102 may be a bendable plastic substrate. However, the disclosure is not limited thereto.

A plurality of data lines (not illustrated) and a plurality of gate lines (not illustrated) may intersect each other in the display region 110, which may be formed with a plurality of pixels that are connected to the data lines and the gate lines. The pixel may receive a data signal transmitted through the data lines in response to a gate signal transmitted through the gate lines, and may emit light corresponding to the data signal. In addition, the display region 110 may further include a power supply line (not illustrated) configured to supply driving power to the pixels. However, the disclosure is not limited thereto.

In addition, a plurality of touch electrodes may be arranged on the display region 110. The touch electrodes may sense a touch on the display region and may generate a corresponding touch sensing signal. Accordingly, a sensing unit (not illustrated) including a plurality of touch electrodes may be arranged on the display region 110 of the display device 100.

The non-display region 120 includes first pad portions 131a arranged in the second region of the substrate 102 and configured to supply pixel driving signals corresponding to the plurality of pixels; second pad portions 131b configured to supply touch sensor signals corresponding to the touch electrodes; a link portion configured to transmit a signal transmitted from the first pad portions 131a and the second pad portions 131b to the display region 110 and the touch electrodes, respectively; and a wiring portion in which a wiring is arranged to interconnect the first and second pad portions 131a and 131b and the link portion.

The first pad portions 131a may be connected to a drive IC (not illustrated) that supplies a data signal, a gate signal and the like (which may be collectively referred to as pixel driving signals), which are related to the driving of the display region, and the second pad portions 131b may be connected to a touch drive IC (not illustrated) that is related to touch driving. In addition, the second pad portions 131b may be disposed on the left and right of the first pad portions 131a. The link portion may allow the data lines and the gate lines arranged in the display region to be connected to the wirings extending from the first pad portions and the second pad portions, and the wiring portion may be arranged between the link portion and the pad portions. In addition, a region of the substrate, which corresponds to the wiring portion, may be a bending region that may allow the substrate to be bent.

In addition, although the display device 100 is illustrated as including a pair of first pad portions 131a and a pair of second pad portions 131b, the disclosure is not limited thereto, and the numbers of the first pad portions 131a and the second pad portions 131b may be determined depending on the size and resolution of the display region 110. In addition, it is illustrated that there are provided a plurality of first pad portions 131a and two second pad portions 131b, but the disclosure is not limited thereto.

The display device 100 may have a bezel region (not illustrated) where a bezel is located on the rim of the display region 110. The non-display region 120 may be disposed in the bezel region, and the pad portions, to which a driver IC, a touch driver IC, and the like are connected, and a wiring that is connected to the link portion from the pad portions, the link portion, and so on may be arranged in the non-display region. Accordingly, when the non-display region 120 is bent, the bezel region may be implemented to have a reduced width. As a result, the effect of a narrow bezel can be further increased. In addition, since the display device 100 includes dual wirings including a first wiring and a second wiring in the bending region, no obstacle is presented to the transmission of a signal even if the substrate 102 is bent and crack is generated in one of the first and second wirings. As a result, the width of the wiring may be reduced to be applicable to a high-resolution display device.

Figure 2:
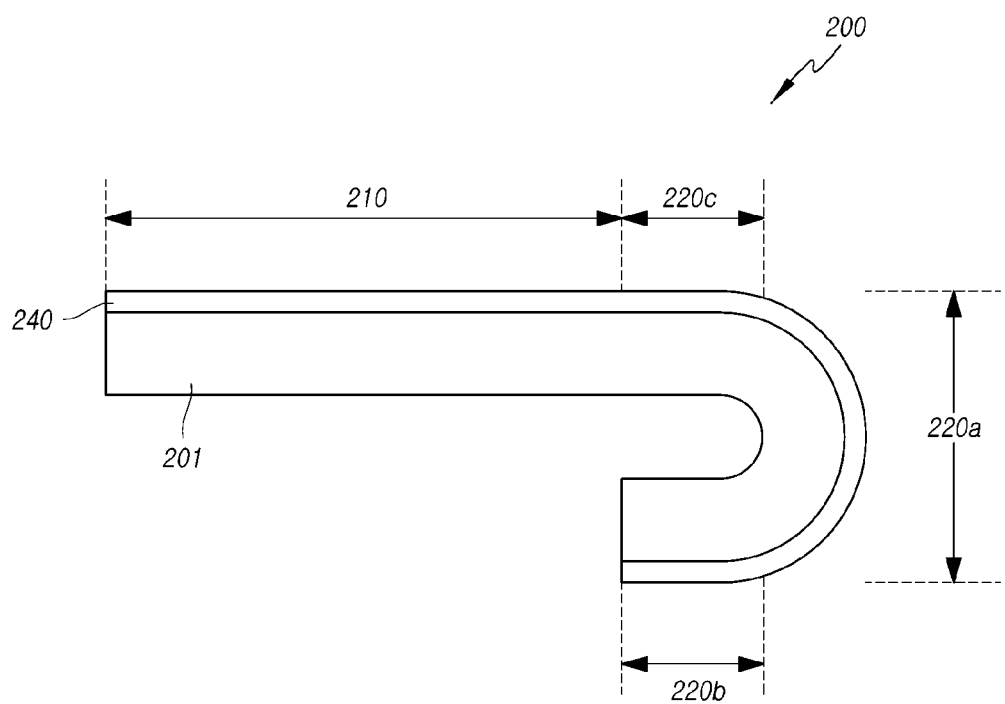
FIG. 2 is a cross-sectional view illustrating an embodiment of the display device illustrated in FIG. 1.

FIG. 2 is a cross-sectional view illustrating an embodiment of the display device illustrated in FIG. 1.

Referring to FIG. 2, the display device 200 may include a display panel 201 and a sensing unit 240, and the sensing unit 240 may be disposed on the display panel 201. In addition, the display device 200 may include a bending region 220a in which one region is bent. In addition, the display panel 201 may be divided into a display region 210 and non-display regions 220a, 220b, and 220c, and the non-display areas 220a, 220b and 220c may include a link portion 220c, a bending region 220a, and a pad portion 220b. Among the non-display regions 220a, 220b, and 220c, the pad portion 220b may be disposed below other portions of the display panel 201 (e.g. below the link region 220c or display region 210) due to the bending region 220a, so that the bezel region can be implemented to be thinner in comparison with the case in which the pad portion is not located below the link region 220c or display region 210.

Figure 3:
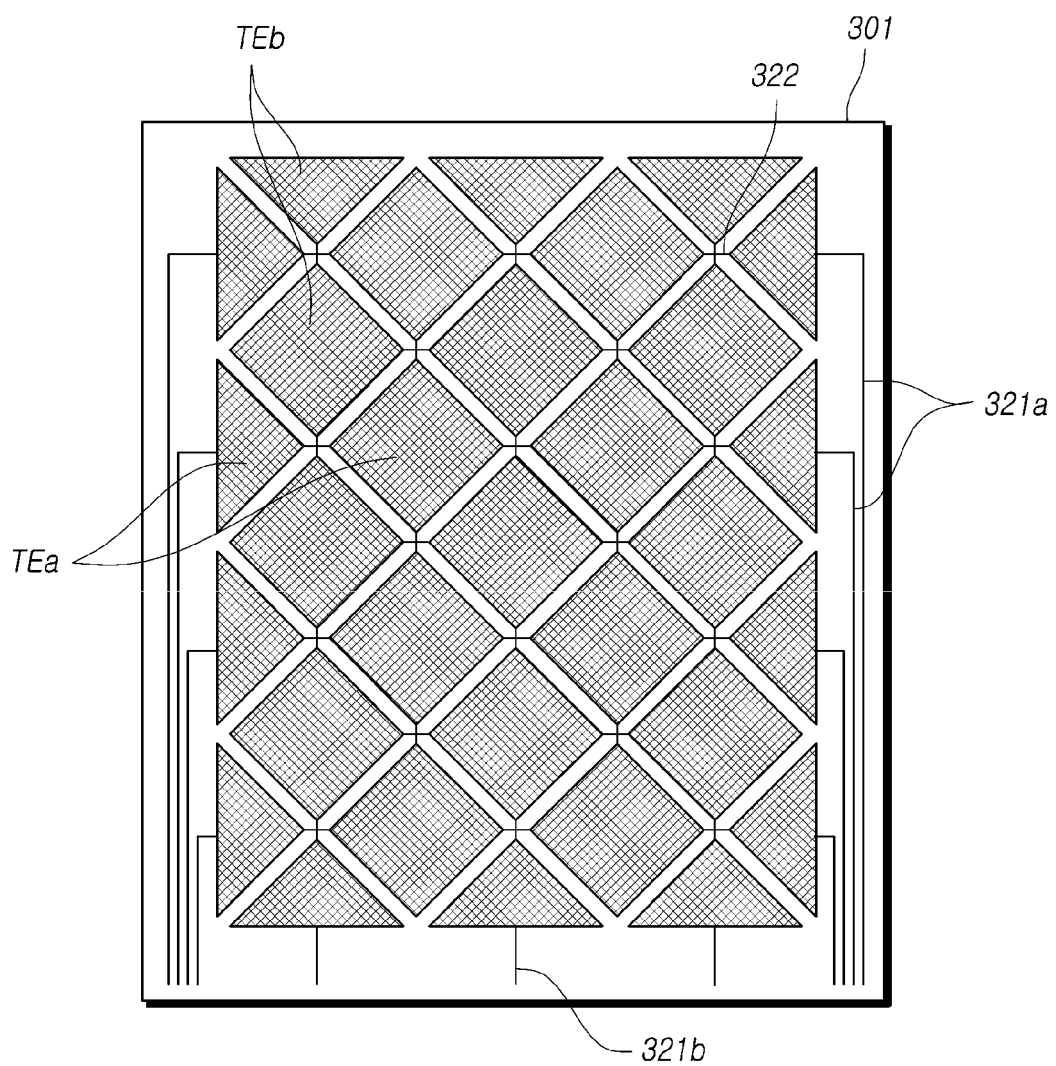
FIG. 3 is a plan view illustrating a first embodiment of a sensing unit employed in the display device illustrated in FIG. 1.

FIG. 3 is a plan view illustrating a first embodiment of a sensing unit employed in the display device illustrated in FIG. 1.

Referring to FIG. 3, the sensing unit may be disposed on a display panel 301, and may include a plurality of first electrodes TEa and a plurality of second electrodes TEb. The plurality of first electrodes TEa may correspond to touch driving electrodes TEa and the plurality of second electrodes TEb may correspond to touch sensing electrodes TEb. The plurality of first electrodes TEa may be connected in the horizontal direction by the connection parts 322 so as to form a plurality of electrode rows, and the plurality of second electrodes TEb may be connected in the vertical direction by the connection part 322 so as to form a plurality of electrode columns. Here, the plurality of first electrodes TEa and the plurality of second electrodes TEb are illustrated as being arranged in a 4×3 form, but this embodiment is not limited thereto.

The first electrodes TEa may receive a touch driving signal, and the second electrodes TEb may transmit a touch sensing signal that corresponds to the touch driving signal. The first electrodes TEa and the second electrodes TEb may be formed on the same layer on the display panel 301. However, this embodiment is not limited thereto.

The connection parts 322 may allow one first electrode TEa to be connected to the other first electrodes, and one second electrode TEb to be connected to the other second electrodes. The connection parts 322 intersect each other. In order to ensure that the first electrodes TEa and the second electrodes TEb are not directly connected to each other, the connection parts 322 that connect the first electrodes TEa to each other may be formed in a layer that is different from the layer in which the first electrodes TEa and the second electrodes TEb are formed, and the first electrodes TEa and the connection parts may be connected to each other through vias. The connection parts 322 that connect the second electrodes TEb to each other may be formed in a layer that is the same as the layer in which the first electrodes TEa and the second electrodes TEb are formed, so that the second electrodes TEb can be connected in the same layer. Accordingly, an insulating film (not illustrated) may be disposed between the connection parts 322 that connect the first electrodes TEa and the connection parts 322 that connect the second electrodes TEb.

In addition, the first electrodes TEa and the second electrodes TEb may be formed by patterning a conductive metallic layer. The first electrodes TEa and the second electrodes TEb may be formed of a transparent material, such as Indium Tin Oxide (ITO). In addition, the patterned first electrodes TEa and second electrodes TEb may include an electrode pattern formed in the form of a mesh, and the first electrodes TEa and the second electrodes TEb may have a plurality of openings. Light, which is emitted from the display device through the first electrodes TEa and the second electrodes TEb made of the ITO electrodes or the plurality of openings included in the first electrodes TEa and the second electrodes TEb, may be transmitted through the first electrodes TEa and the second electrodes TEb, or may be emitted to the outside through the plurality of openings.

The patterns of the first electrodes TEa and the second electrodes TEb formed in the form of a mesh may be referred to as a touch electrode wiring. In addition, the first electrodes TEa and the second electrodes TEb may be connected to driving lines 321a that cause a driving signal, which drives the first electrodes TEa and the second electrode TEb, to be applied to a touch electrode, and sensing lines 321b that cause a sensing signal, which is generated in response to a touch sensed by the touch electrode, to be transmitted. The driving lines 321a and the sensing lines 321b may be referred to as touch wirings. In addition, the touch wirings including the driving lines 321a and the sensing lines 321b may be respectively connected to the second pad portions illustrated in FIG. 1.

Figure 4:
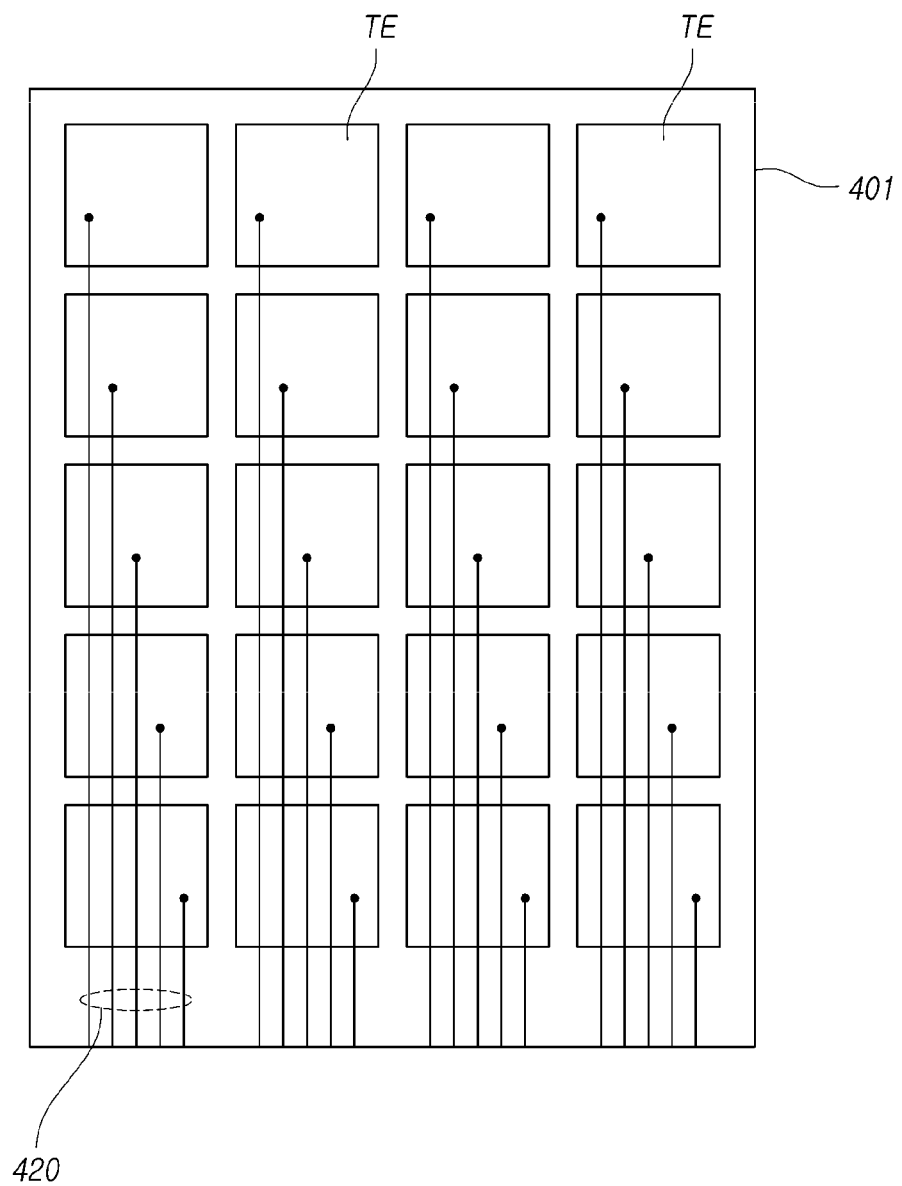
FIG. 4 is a plan view illustrating a second embodiment of the sensing unit employed in the display device illustrated in FIG. 1.

FIG. 4 is a plan view illustrating a second embodiment of the sensing unit employed in the display device illustrated in FIG. 1.

Referring to FIG. 4, the sensing unit may be disposed on the display panel 401, and a plurality of touch electrodes TE each having a predetermined area may be arranged in a matrix form on the display panel 401. In addition, a plurality of touch wirings 420 may be respectively connected to the touch electrodes TE so as to receive a touch sensing signal from the touch electrodes TE. The touch wirings 420 are disposed under the touch electrodes and may be in contact with a region of the touch electrodes TE. The touch electrodes TE and the touch wirings 420 may be mounted in the display panel 401, and as a result, when the display device 401 is made not to include a separate touch panel on the display panel 401, the display panel 401 may be implemented to be thinner.

Figure 5:
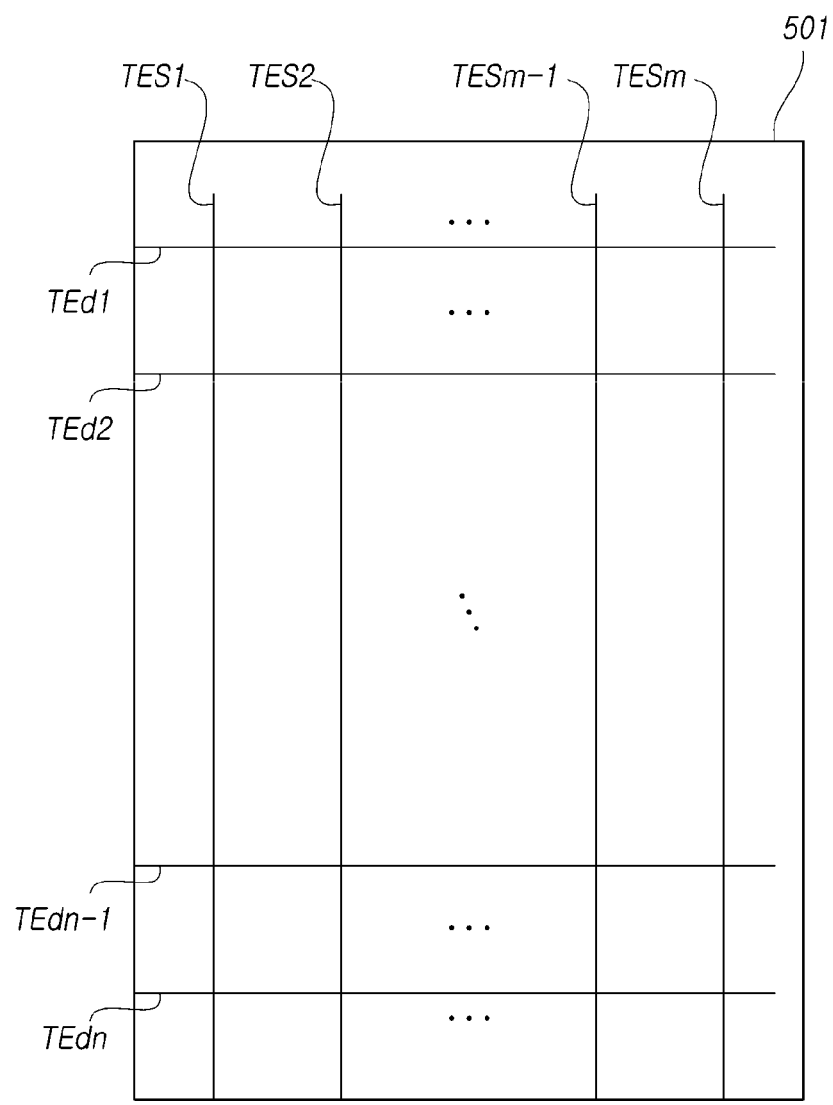
FIG. 5 is a plan view illustrating a third embodiment of the sensing unit employed in the display device illustrated in FIG. 1.

FIG. 5 is a plan view illustrating a third embodiment of the sensing unit employed in the display device illustrated in FIG. 1.

Referring to FIG. 5, the sensing unit may be disposed on the display panel 501, and may include first touch electrodes TEd1, TEd2, . . . , TEdn−1, and TEdn arranged in the vertical direction on the display panel 501, and second touch electrodes TES1, TES2, . . . , TESm−1, and TESm disposed on the display panel 501 and arranged in the horizontal direction. In addition, the first touch electrodes TEd1, TEd2, . . . , TEdn−1 and TEdn arranged in the vertical direction may be called touch driving electrodes, and the second touch electrodes TES1, TES2, . . . , TESm−1, and TESm may be called touch sensing electrodes. In addition, an insulating film (not illustrated) may be disposed between the first touch electrodes TEd1, TEd2, . . . , TEdn−1, TEdn and the second touch electrodes TES1, TES2, . . . , TESm−1, and TESm, so that the first touch electrodes TEd1, TEd2, . . . , TEdn−1, TEdn and the second touch electrodes TEs1, TEs2, . . . , TEsm−1, TEsm can be capacitively coupled to each other. In addition, the sensing unit can sense a change in capacitance caused between the first touch electrodes TEd1, TEd2, . . . , TEdn−1, and TEdn and the second touch electrodes TES1, TES2, . . . , TESm−1, and TESm by a touch in order to detect a touch position.

Figure 6:
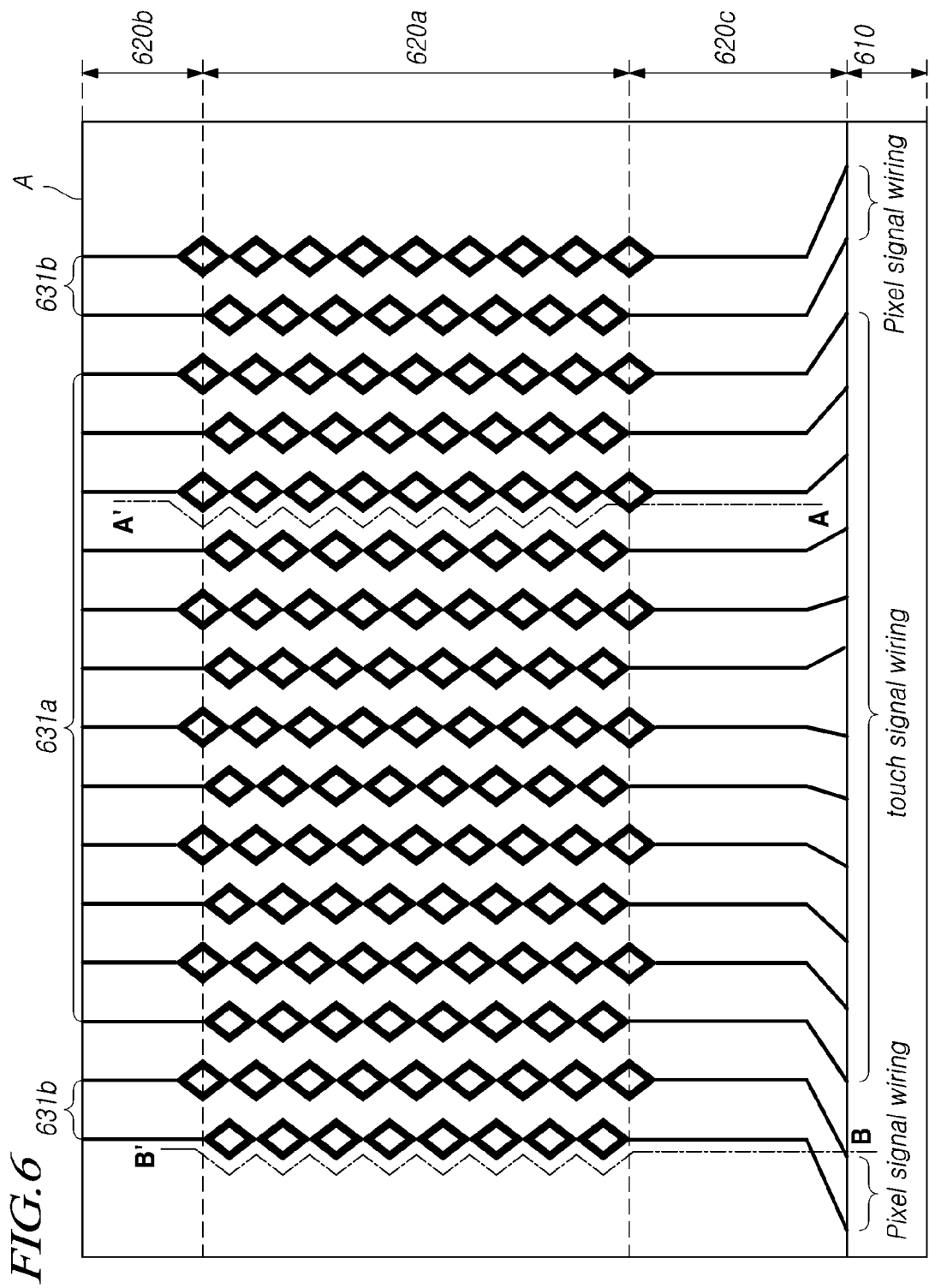
FIG. 6 is a plan view illustrating an embodiment of a non-display region employed in the display device illustrated in FIG. 1.

FIG. 6 is a plan view illustrating an embodiment of a non-display region employed in the display device illustrated in FIG. 1.

Referring to FIG. 6, the non-display region A may include a pad portion 620b, a link portion 620c, and a wiring portion 620a.

The pad portion 620b may be divided into a first pad portion 631a and a second pad portion 631b, in which the first pad portion 631a may receive a signal that is to be applied to a plurality of pixels arranged in the display region 610, and the second pad portion 631b may receive a signal that is to be applied to the touch electrodes. The link portion 620c transmits the received signals to the pixels or touch electrodes. The wiring portion 620a interconnects the pad portion 620b and the link portion 620c and transmits signals from the pad portion 620b to the link portion 620c. The wiring portion 620a may be disposed in the bending region to be bent. A first wiring and a second wiring on the first wiring may be disposed in the wiring portion 620a. In addition, the second wiring may not be disposed on the first wiring in portions of the link portion 620c. The second wiring may be disposed above the first wiring that is disposed in the pad portion 620b and the wiring portion 620a. In addition, the second wiring may include a ring-shaped pattern having an empty central region in order to prevent the second wiring from being completely cut off even if a crack is generated in the second wiring. Even if a crack is generated in the second wiring, the crack can be prevented from propagating by the empty central region of the ring shape in which no wiring is deposited. Accordingly, even if the substrate is bent and as a result a crack is generated in the second wiring, it is possible to reduce the frequency of complete cut-off caused in the second wiring. For example, the ring-shaped pattern may be a pattern having a rectangular ring shape, diamond ring shape, or circular ring shape, or other types of ring shapes. However, this embodiment is not limited thereto. In addition, the first wiring may be formed with a ring-shaped pattern to correspond to the shape of the second wiring pattern.

In addition, since the wiring portion 620a has dual wirings configured with the first wiring and the second wiring, even if one wiring is cut off, the other wiring can be prevented from being cut off, and as a result, it is possible to implement the wiring to have a reduced width. Therefore, it can be easily applied to a display device having a high resolution.

Figure 7:
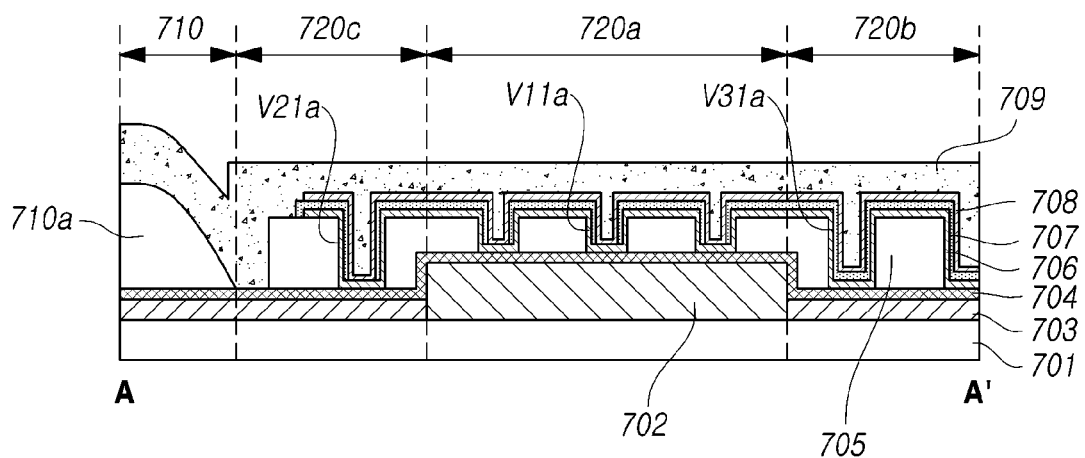
FIG. 7 is a cross-sectional view illustrating a first embodiment of the non-display region of the display device of FIG. 6 taken along line A-A' in FIG. 6.
Figure 8:
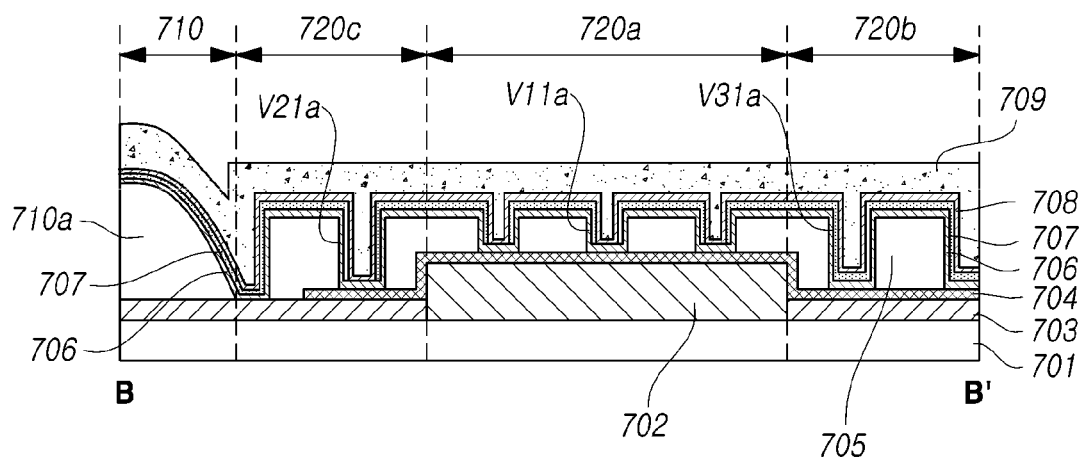
FIG. 8 is a cross-sectional view illustrating the first embodiment of the non-display region of the display device of FIG. 6 taken along line B-B' in FIG. 6.

FIG. 7 is a cross-sectional view illustrating a first embodiment of the non-display region of the display device of FIG. 6 taken along line A-A' in FIG. 6. FIG. 8 is a cross-sectional view illustrating the first embodiment of the non-display region of the display device of FIG. 6 taken along line B-B' in FIG. 6.

The display device may include: a substrate 701 divided into a display region 710 and non-display regions 720a (e.g. wiring region), 720b (e.g. pad region), and 720c (e.g. link region); a first organic film 702 disposed in one of the non-display regions 720a, 720b, and 720c; a first wiring 704 formed in a predetermined pattern on the substrate 701 on which the first organic film 702 is disposed; a second organic film 705 formed on the first wiring 704 and formed with via holes V11a, V21a, and V31a that cause the first wiring 704 to be exposed; and second wirings 706, 707, and 708 formed on the first wiring 704 in a predetermined pattern and connected to the first wiring 704 at one or more spaced apart locations above the first organic film 702 that correspond to the via holes V11a, V21a, and V31a.

Referring to FIG. 7, the first organic film 702 may be formed on a substrate 701, and the first wiring 704 may be deposited on the substrate 701 having the first organic film 702 formed thereon. The substrate 701 may be a plastic substrate. The first wiring 704 extends to the display region 710 and is electrically connected to the pixels because the first wiring 704 is a wiring for supplying signals to the pixels disposed in the display region 710. The first organic film 702 may be formed when depositing a gate insulating film formed before the gate electrodes of transistors formed in the pixels are formed. In addition, a buffer layer 703 may be formed between the substrate 701 and the first wiring 704. The buffer layer 703 is made from a different material than the organic film 702. Further, the first wiring 704 may be a source/drain metal forming source and drain electrodes of a transistor. The first organic film 702 may be formed at a position corresponding to the bending region of the substrate 701. Since the first organic film 702 is formed of a soft material, it can flex smoothly when the substrate 701 is bent so that a crack can be prevented from being generated in the first wiring 704.

In addition, a second organic film 705 may be formed on the first wiring 704 and one or more via holes V11a, V21a, and V31a may be formed therein. The first wiring 704 and the second wirings 706 and 707 and 708 are in different layers. The first wiring 704 is separated from the second wirings 706, 707 and 708 by the second organic film 705 at multiple locations such that the first wiring 704 is a predetermined distance from the second wirings 706, 707 and 708 at those locations. The first wiring 704 and the second wirings 706, 707, and 708 can be connected to each other in specific regions via the via holes V11a, V21a, and V31a. The connections cause the first wiring 704 and the second wiring 706, 707 and 708 to be electrically connected to each other. Since a signal supplied to a pixel is transmitted through the first wiring 704 and the second wirings 706, 707, and 708, even if the wiring of any one of the first wiring 704 and the second wirings 706, 707, and 708 is cut off, the signal can be supplied to the pixel. In addition, the second wirings 706, 707, and 708 may cover the second organic film 705 and may not extend past the edge of the second organic film 705 in the link portion 720c. Via hole V11a is formed in the second organic film 705 above the first organic film 702 and above the first wiring 704. Via holes V21a and V31a are formed above the first wiring 704 but not above the first organic film 702. However, without being limited thereto, the via holes V11a may be formed only above the first organic film 702. Also, one or more via holes V11a may be formed above the first organic film 702.

Then, a third organic film 709 may be deposited on the second wirings 706, 707, and 708.

Referring to FIG. 8, FIG. 8 illustrates a cross section of a second pad portion that transmits touch signals to touch electrodes and a touch wiring that applies signals to the touch electrodes. The structure illustrated in FIG. 8 is different from that illustrated in FIG. 7 in that, since signals are applied to the touch electrodes, the first wiring 704 is formed only up to a region of the link portion 720c in the non-display region, while the second wirings 706, 707, 708 may extend to a portion above the display region 710 and may become touch electrodes. Thus, the second wirings 706, 707, 708 are electrically connected to one or more touch electrodes. In addition, in the display region 710, an in-cap substrate 710a may be disposed on the substrate 701. Accordingly, the touch electrodes formed by the second wires 706, 707, and 708 may be disposed on the in-cap substrate 710a, so that it is possible to include a sensing unit in the display device by arranging the touch electrodes without using a separate touch panel. However, this embodiment is not limited thereto, and a transistor, a light-emitting layer, an electrode, and the like may be further formed between the substrate 701 and the in-cap substrate 710a.

In addition, the third organic film 709 deposited on the second wirings 706, 707, and 708 compensates for the step difference generated by the touch electrodes in the display region 710, so that the upper portion of the display region 710 is planarized.

Further, the second wirings 706, 707, and 708 may include a first metal layer 706, an insulating film 707 disposed on the first metal layer 706, and a second metal layer 708 on which the insulating film 707 is disposed. The first metal layer 706 may correspond to the metal layer forming the connection parts 322 in the sensing unit illustrated in FIG. 3, and the second metal layer 708 may correspond to the metal layer forming the first electrode TEa and the second electrode TEb in the sensing unit illustrated in FIG. 3. Further, the insulating film 707 may be an insulating film disposed between the first and second electrodes TEa and TEb and the connection parts 322. Further, the first metal layer 706 may be the touch wiring 420 illustrated in FIG. 4, the second metal layer 708 may be the touch electrode TE illustrated in FIG. 4, and the insulating film is disposed between the touch electrode wiring and the touch electrodes. Further, the first metal layer 706 corresponds to the metal layer forming the first touch electrodes TEd1, TEd2, . . . , TEdn−1, and TEdn illustrated in FIG. 5, and the second metal layer 708 corresponds to the metal layer forming the second electrodes TES1, TES2, . . . , TESm−1, and TESm. Further, the insulating film 707 may correspond to the insulating film disposed between the first touch electrodes TEd1, TEd2, . . . , TEdn−1, and TEdn and the second touch electrodes TES1, TES2, . . . , TESm−1, and TESm illustrated in FIG. 5.

Figure 9:
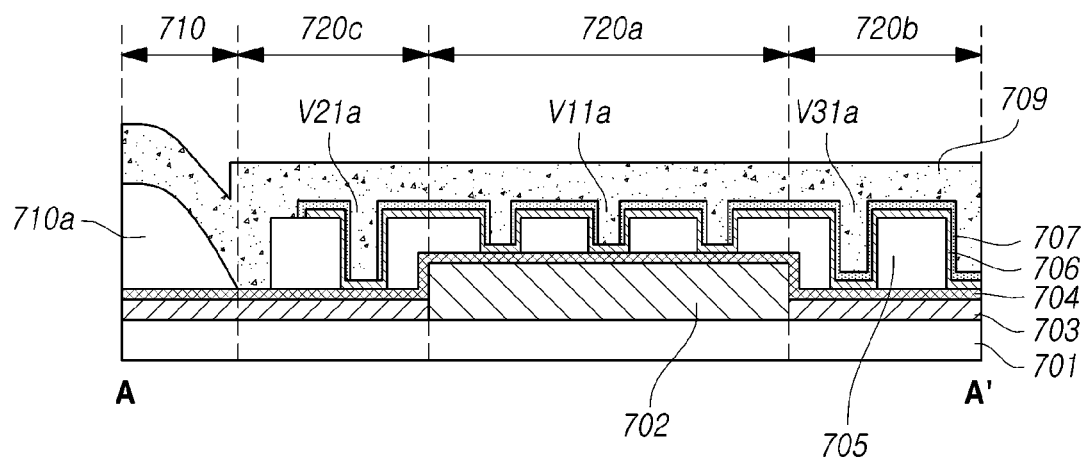
FIG. 9 is a cross-sectional view illustrating a second embodiment of the non-display region of the display device of FIG. 6 taken along line A-A' in FIG. 6.
Figure 10:
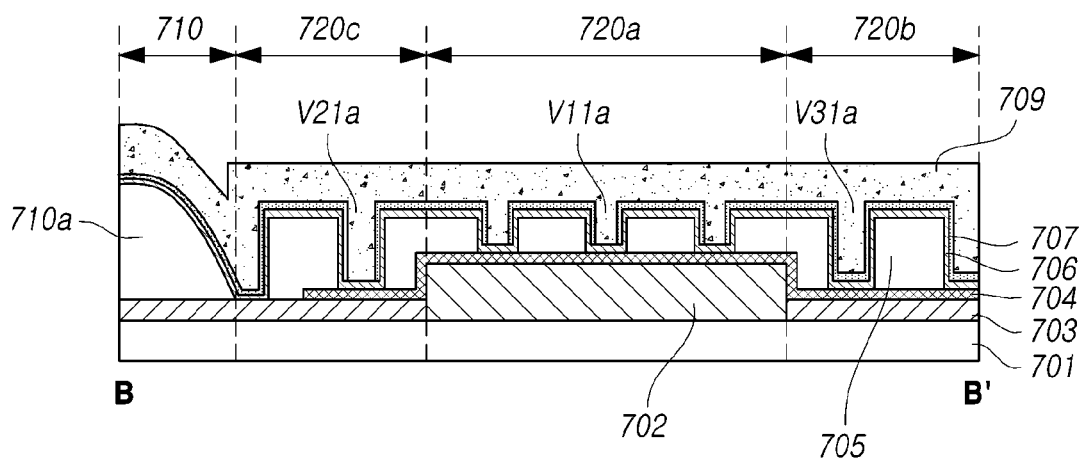
FIG. 10 is a cross-sectional view illustrating the second embodiment of the non-display region of the display device of FIG. 6 taken along line B-B' in FIG. 6.

However, this embodiment is not limited thereto. The second wiring may include a first metal layer 706 and an insulating film 707 disposed on the first metal layer 706, as illustrated in FIG. 9 or 10.

Figure 11:
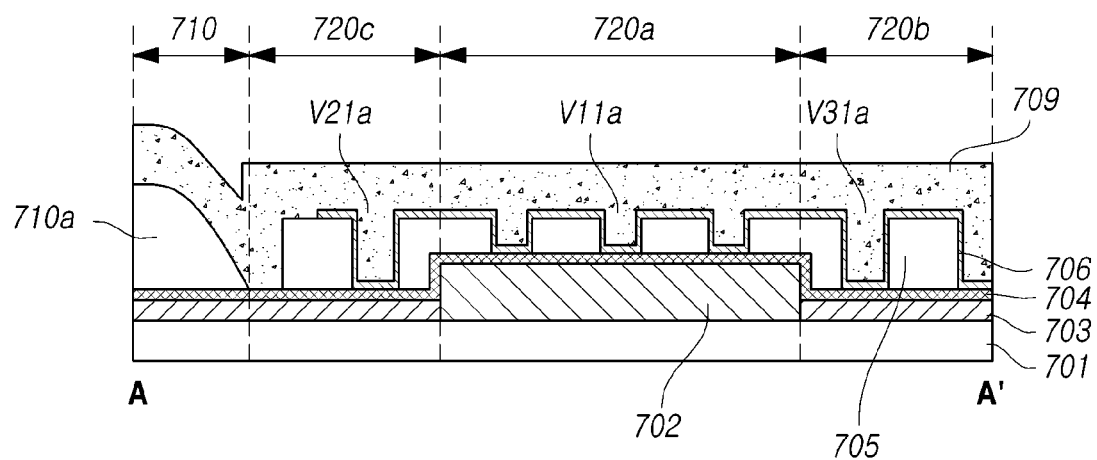
FIG. 11 is a cross-sectional view illustrating a third embodiment of the non-display region of the display device of FIG. 6 taken along line A-A' in FIG. 6.
Figure 12:
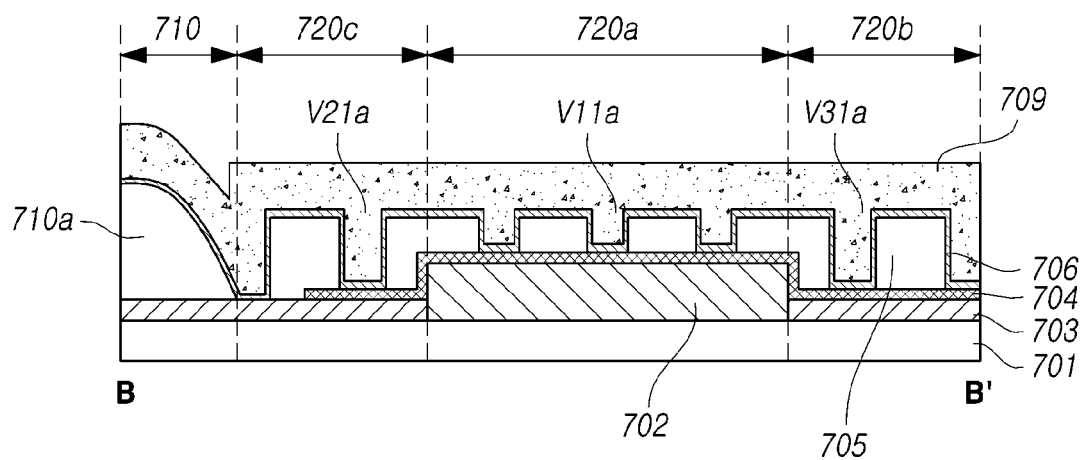
FIG. 12 is a cross-sectional view illustrating the third embodiment of the non-display region of the display device of FIG. 6 taken along line B-B' in FIG. 6.

In addition, as illustrated in FIG. 11 or 12, the second wiring may be formed of a first metal layer 706.

Figure 13:
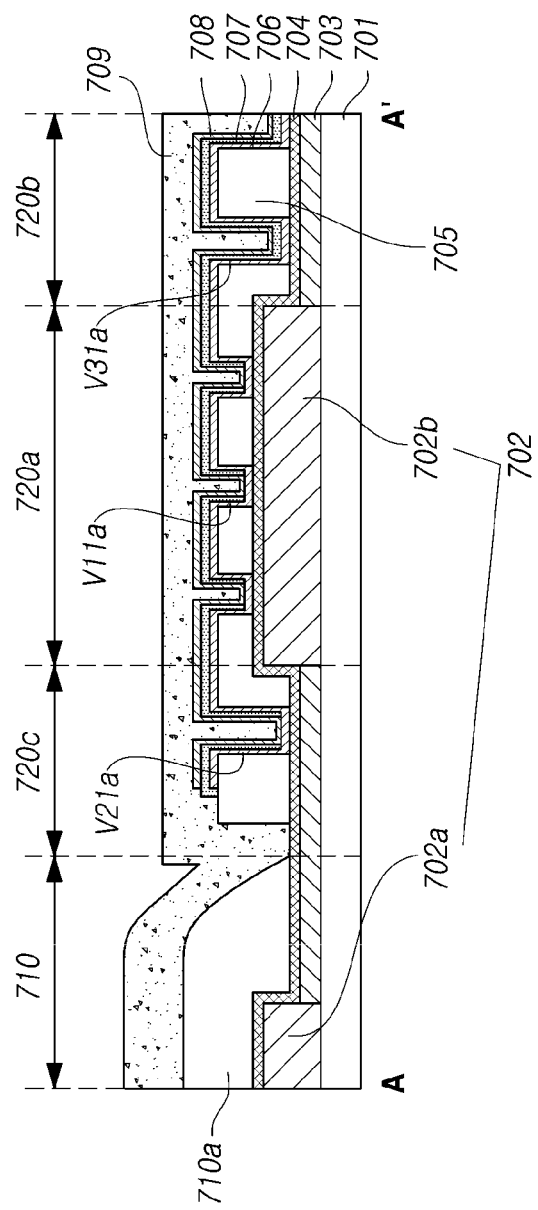
FIG. 13 is a cross-sectional view illustrating a first embodiment of the non-display region of the display device of FIG. 6 taken along line A-A' in FIG. 6.
Figure 14:
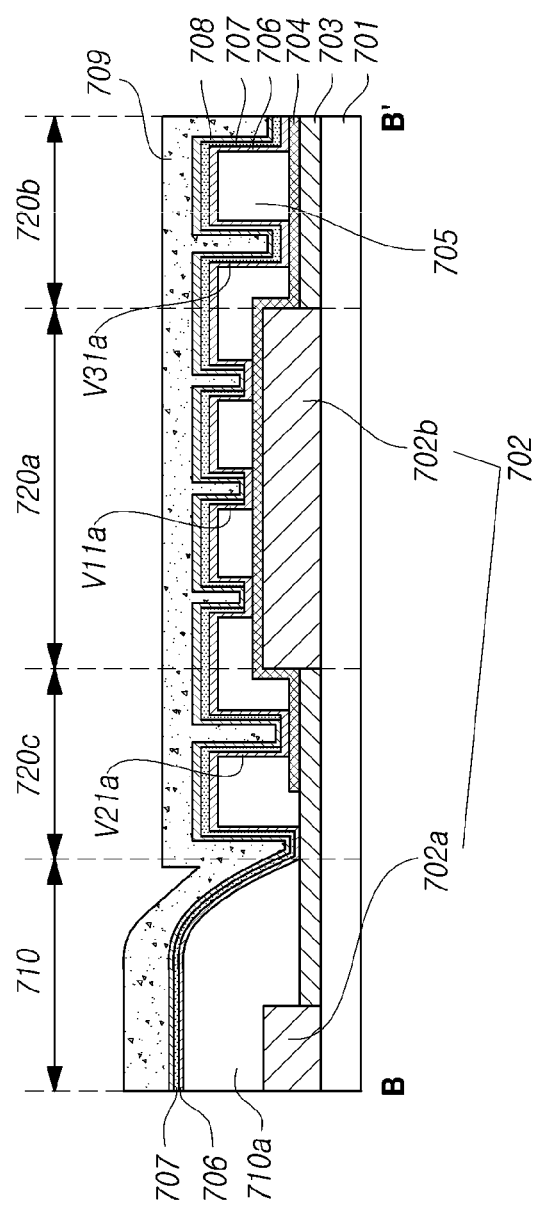
FIG. 14 is a cross-sectional view illustrating the first embodiment of the non-display region of the display device of FIG. 6 taken along line B-B' in FIG. 6.

FIG. 13 is a cross-sectional view illustrating a first embodiment of the non-display region of the display device of FIG. 6 taken along line A-A' in FIG. 6. FIG. 14 is a cross-sectional view illustrating the first embodiment of the non-display region of the display device of FIG. 6 taken along line B-B' in FIG. 6.

The display device may include a substrate 701 divided into a display region 710 and non-display regions 720a (e.g. wiring region), 720b (e.g. pad region), and 720c (e.g. link region). A first organic film 702 is disposed in one of the non-display regions 720a, 720b, and 720c. The first organic film 702 includes a first portion 702a and a second portion 702b and the first portion 702a is located in the display region 710 and the second portion 702b is located in one of the non-display region 720a, 720b, and 720c. An opening in the first organic film 702 is located between the first portion 702a and the second portion 702b of the first organic film 702. A first wiring 704 is formed in a predetermined pattern on the substrate 701 on which the first organic film 702 is disposed. A second organic film 705 is formed on the first wiring 704 and formed with via holes Vila, V21a, and V31a that cause the first wiring 704 to be exposed. Second wirings 706, 707, and 708 are formed on the first wiring 704 in a predetermined pattern and connected to the first wiring 704 at one or more spaced apart locations above the first organic film 702 that correspond to the via holes V11a, V21a, and V31a.

Referring to FIGS. 13 and 14, the first organic film 702 may be formed on the substrate 701, and the first wiring 704 may be deposited on the substrate 701 having the first organic film 702 formed thereon. The substrate 701 may be a plastic substrate. The first wiring 704 extends over the second portion of the first organic film 702 in the non-display region 720a, 720b,720c and also extends over the opening in the first organic film 702. The first wiring 704 carries a signal to the display region 710 and is electrically connected to the pixels because the first wiring 704 is a wiring for supplying signals to the pixels disposed in the display region 710.

In addition, the second organic film 705 may be formed on the first wiring 704 and one or more via holes Vila, V21a, and V31a may be formed therein. The first wiring 704 and the second wirings 706 and 707 and 708 are in different layers. The first wiring 704 is separated from the second wirings 706, 707 and 708 by the second organic film 705 at multiple locations such that the first wiring 704 is a predetermined distance from the second wirings 706, 707 and 708 at those locations. The first wiring 704 and the second wirings 706, 707, and 708 can be connected to each other in specific regions via the via holes Vila, V21a, and V31a. The connections cause the first wiring 704 and the second wiring 706, 707 and 708 to be electrically connected to each other. And the second wiring 706 on the second organic film 705 is electrically connected to the first wiring 704 in the non-display region 720a, 720b, 720c.

Figure 15:
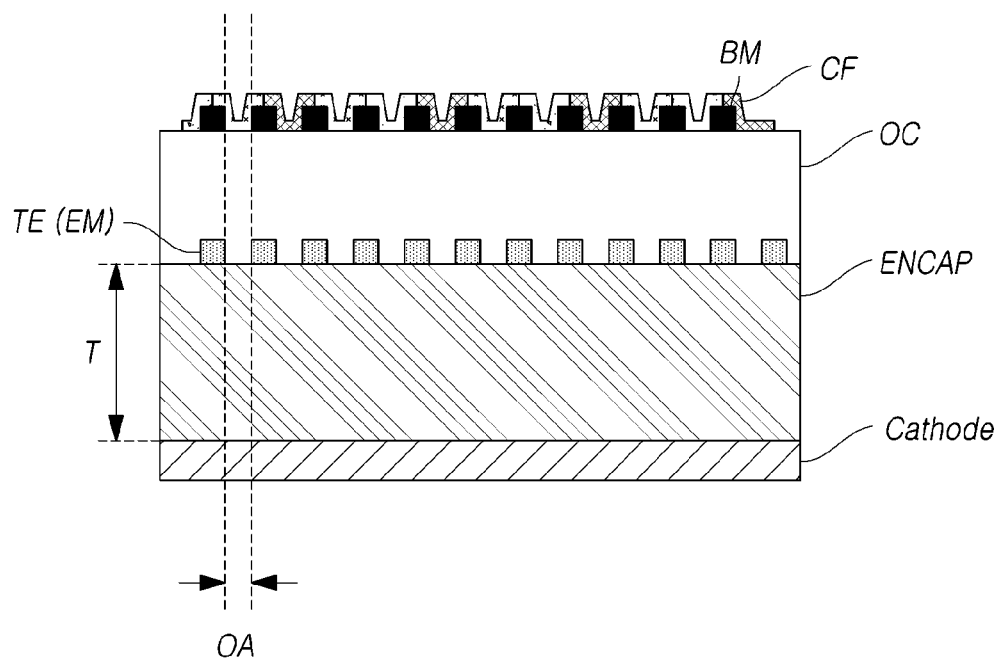
FIG. 15 is a cross-sectional view illustrating a first embodiment of a display region of the display device of FIG. 1.
Figure 16:
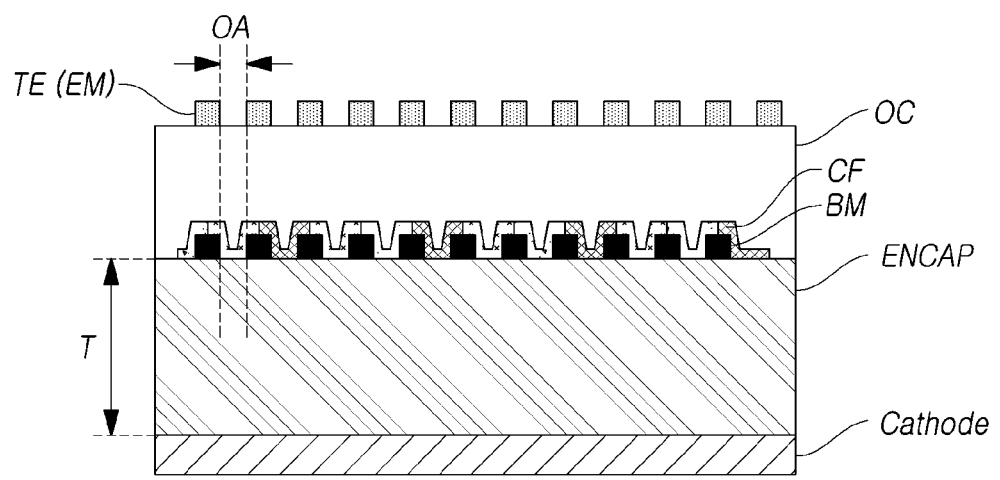
FIG. 16 is a cross-sectional view illustrating a second embodiment of the display region of the display device of FIG. 1.

FIG. 15 is a cross-sectional view illustrating a first embodiment of a display region of the display device illustrated in FIG. 1. FIG. 16 is a cross-sectional view illustrating a second embodiment of the display region of the display device of FIG. 1.

The touch electrodes TE may be formed in the display device. The touch electrodes may be made from electrode metal (EM). Here, the display device may be an OLED display device using OLEDs, and when the touch electrodes TE are formed in the display device, the touch electrodes may be positioned between an encapsulation layer ENCAP and a display cover (not shown). Also, the touch electrodes TE may be a plurality of electrodes and a plurality of signal lines having a plurality of electrode patterns.

Further, as illustrated in FIG. 15, the touch electrodes TE may be disposed on the encapsulation layer ENCAP, and as illustrated in FIG. 16, the touch electrodes TE may be disposed on the overcoat layer OC. That is, the touch electrodes TE may be included in the display device without using a separate touch panel. The encapsulation layer ENCAP has a thickness T and is disposed on a cathode.

Referring to FIG. 15, the touch electrodes TE may be formed on the encapsulation layer ENCAP, and an overcoat layer OC may be formed on the touch electrodes TE. In addition, a black matrix BM may be disposed on the overcoat layer OC at a position corresponding to the touch electrodes TE, and color filters CF may be disposed above the black matrix BM. A display cover (not illustrated) may be disposed on the color filters CF.

As described above, by forming the touch electrodes TE on the encapsulation layer ENCAP, the touch electrodes TE can be formed without greatly affecting the display performance and the formation of the layer for the display.

Meanwhile, in the case of a touch sensing method of a mutual capacitance type, connection parts for connecting the driving electrodes and/or the sensing electrodes may exist among the plurality of touch electrodes TE. The connection parts may be present in a layer that is different from the layer of the touch electrodes TE with an insulating layer interposed therebetween.

Meanwhile, referring to FIG. 15, a cathode of one or more Organic Light-Emitting Diodes (OLED) may exist under the encapsulation layer ENCAP.

The thickness T of the encapsulation layer ENCAP may be, for example, 5 micrometers or more.

Parasitic capacitance formed between the cathode of the OLED and the touch electrodes TE may be reduced by designing the thickness (T) of the encapsulation layer ENCAP to be 5 micrometers or more. Thus, it is possible to prevent deterioration in touch sensitivity due to parasitic capacitance.

On the other hand, when the touch electrodes TE are formed of a mesh-type electrode metal EM having open regions OA, the position of each of the open regions OA may correspond to one or two or more sub-pixels or the positions of light-emitting units when viewed in the vertical direction.

Therefore, as illustrated in FIG. 15, the plurality of open regions OA may correspond to the plurality of color filters CF.

As described above, in an OLED display device, it is possible to provide a display device having excellent light-emitting performance by arranging the color filters CF, which are necessary in the case where white OLEDs or the like are used, to correspond to the open regions OA.

The vertical positional relationship between the color filters CF and the touch electrodes TE will now be described.

As described above, it is possible to provide a touch display device 100 having an optimal positional relationship between the color filters CF and the touch electrodes TE in consideration of display performance, such as light-emitting performance, and touch performance.

Meanwhile, attempts to incorporate a touch panel including touch electrodes TE in a display panel 110 have been made in order to improve manufacturing convenience of the touch display device 100 and to reduce the size of the touch display device 100.

However, there are considerable difficulties and many constraints in order to incorporate sensing units TSP in a display device. For example, during the process of manufacturing a display device, there is a limit in that a high-temperature process for forming touch electrodes TE, which are generally made of a metallic material, inside a panel cannot be freely performed due to the presence of an organic material. Therefore, when the touch electrodes TE are formed on the overcoat layer OC, a high-temperature process can be performed more freely.

Referring to FIG. 16, a black matrix may be formed on the encapsulation layer ENCAP, and color filters CF may be disposed on the black matrix BM. The overcoat layer OC may be formed on the color filters CF. In addition, the electrode pattern of the touch electrodes TE may be disposed on the overcoat layer OC at the positions corresponding to the black matrix BM. A display cover (not illustrated) may be disposed on the color filters CF.

Meanwhile, in the case of a touch sensing method of a mutual capacitance type, there may be connection parts for connecting the driving electrodes and/or the sensing electrodes, among the plurality of touch electrodes TE. The connection parts may be present in a layer that is different from the layer of the touch electrodes TE with an insulating layer interposed therebetween.

FIG. 17 is a flowchart illustrating a method of manufacturing a display device according to the disclosure.

Referring to FIG. 17, a method of manufacturing a display device may form a first organic film on a substrate (S1500). The first organic film may be formed corresponding to a bending region to be bent in a non-display region.

Then, the first wiring may be deposited and patterned on the first organic film (S1510). The first wiring may be a source drain metal that supplies a signal to a pixel formed in a display region. Further, when the first wiring is a wiring configured to supply a signal to the display region, the first wiring may extend to the display region. However, when the first wiring is a wiring configured to supply a signal to the touch electrode, the first wiring may be formed only in the non-display region without extending to the display region.

Then, a second organic film may be deposited above the first wiring, at least one via hole may be formed in the second organic film so as to cause the first wiring to be exposed above an upper side of the first organic film, and a second wiring may be deposited and patterned above the second organic film, and the second wiring may be connected to the first wiring via the via hole (S1520). The second wiring may be formed to have a ring-shaped pattern. Even if cracks occur in the second wiring due to the ring shape, the cracks occurring in the ring shape can be prevented from cutting off the entire ring shape owing to the central region of the ring shape in which no metal layer is formed. Also, since it is possible to avoid a cut-off portion by portions connected through via holes even if the first wiring or the second wiring is cut off, it is possible to prevent a signal from failing to be transmitted even if cracks occur due to bending. Also, the greater the number of via holes, the greater the number of cracks that can be tolerated.

The second wiring may include a plurality of metal layers. In addition, the second wiring may include a first metal layer, a second organic film disposed on the first metal layer, and a second metal layer above which the second organic film is disposed. The first metal layer may correspond to the connection parts 322 in the sensing unit illustrated in FIG. 3, and the second metal layer may correspond to the first electrodes TEa and the second electrodes TEb in the sensing unit illustrated in FIG. 3. In addition, the first metal layer may correspond to the touch wiring 420 in the sensing unit illustrated in FIG. 4, and the second metal layer may correspond to the touch electrodes TE in the sensing unit illustrated in FIG. 4. In addition, the first metal layer may correspond to the first electrodes TEd1, TEd2, . . . , TEdn−1, and TEdn in the sensing unit illustrated in FIG. 5, and the second metal layer may correspond to the second electrodes TEs1, TEs2, . . . , TEsm−1, TEsm in the sensing unit illustrated in FIG. 5.

When the second wiring corresponds to a wiring for supplying a signal to the display region, the second wiring may extend only to the non-display region. In addition, when the second wiring corresponds to a wiring for supplying a signal to touch electrodes, the second wiring may extend to the display region so as to correspond to the touch electrodes disposed above the display region.

Accordingly, even if the first wiring and the second wiring are connected to each other at one point of the bending region and cracks occur in the first wiring and/or the second wiring, a signal can be transmitted.

The above description and the accompanying drawings provide an example of the technical idea of the disclosure for illustrative purposes only. Those having ordinary knowledge in the technical field, to which the disclosure pertains, will appreciate that various modifications and changes in form, such as combination, separation, substitution, and change of a configuration, are possible without departing from the essential features of the disclosure. Therefore, the embodiments disclosed in the disclosure are intended to illustrate the scope of the technical idea of the disclosure, and the scope of the disclosure is not limited by the embodiment. The scope of the disclosure shall be construed on the basis of the accompanying claims in such a manner that all of the technical ideas included within the scope equivalent to the claims belong to the disclosure.

What is claimed is:
1. A display device comprising:
a display region that comprises a plurality of pixels on a substrate and a touch electrode configured to sense a touch; and
a non-display region separate from the display region, wherein the non-display region comprises a bending region where the substrate is bent and wiring to carry a signal corresponding to the plurality of pixels or corresponding to the touch electrode, the wiring including:

first wiring; and second wiring above the first wiring in the bending region, wherein the first wiring is physically connected with the second wiring in the bending region through a via in an organic film disposed between the first wiring and the second wiring in the bending area, wherein the first wiring carries the signal corresponding to the plurality of pixels where the first wiring extends from the non-display region including the bending region to the display region on the substrate, wherein the first wiring carries the signal for the touch electrode where the first wiring is not formed in the display region on the substrate.

2. The display device of claim 1, wherein the non-display region comprises:

a pad portion to receive the signal corresponding to the plurality of pixels or corresponding to the touch electrode;

a link portion to transmit the signal to the plurality of pixels or to the touch electrode; and a wiring portion in the bending region and interconnecting the pad portion and the link portion, the wiring being in the wiring portion.

3. The display device of claim 1, wherein the signal is a signal corresponding to the plurality of pixels, and the first wiring is electrically connected to the plurality of pixels.

4. The display device of claim 1, wherein the signal is a signal corresponding to the touch electrode, and the second wiring is electrically connected to the touch electrode.

5. The display device of claim 1, wherein the bending region includes another organic film disposed above the substrate, wherein the first wiring is disposed above the another organic film.

6. The display device of claim 1, wherein the second wiring is electrically connected in the bending region to the first wiring at a plurality of spaced apart locations.

7. The display device of claim 6, further comprising a plurality of via holes at the spaced apart locations and the second wiring is electrically connected to the first wiring through the via holes.

8. The display device of claim 1, wherein the second wiring includes a first metal layer and an insulating film disposed on the first metal layer.

9. The display device of claim 8, wherein the second further includes a second metal layer disposed above the insulating film.

10. The display device of claim 1, wherein at least one of the first wiring and the second wiring has a ring-shaped pattern in the bending region.

11. The display device of claim 1, wherein the display region comprises:

a cathode corresponding to one or more organic light emitting diodes (OLEDs); and an encapsulation layer on the cathode, wherein the touch electrode is disposed on the encapsulation layer.

12. The display device of claim 1, wherein the connection comprises a plurality of physical connections between the first wiring and the second wiring that are made in the bending region through a plurality of vias in the organic film.

13. The display device of claim 1, wherein the first wiring is a source and drain metal forming source and drain electrodes of a transistor included in at least one of the plurality of pixels.

14. A display device comprising:

a substrate divided into a display region and a non-display region, the display region comprising a plurality of pixels on a substrate and a touch electrode configured to sense a touch;

a first organic film disposed in the non-display region;

a first wiring in a predetermined pattern on the first organic film in the non-display region;

a second organic film above the first wiring, a via hole in the second organic film exposing a portion of the first wiring; and a second wiring in the predetermined pattern above the first wiring and electrically connected to the first wiring at one or more locations through the via hole, at least one of the locations corresponding to the via hole, wherein the first wiring carries a signal corresponding to the plurality of pixels where the first wiring extends from the non-display region including a bending region to the display region on the substrate, wherein the first wiring carries the signal for the touch electrode where the first wiring is not formed in the display region on the substrate.

15. The display device of claim 14, further comprising:

a cathode layer corresponding to one or more organic light emitting diodes (OLEDs) on the substrate in the display region;

an encapsulation layer disposed on cathode layer; and a touch electrode on the encapsulation layer, wherein the second wiring and the touch electrode are in a same metal layer.

16. The display device of claim 14, wherein the second wiring includes a first metal layer and an insulating film disposed on the first metal layer.

17. The display device of claim 16, wherein the second wiring further includes a second metal layer disposed above the insulating film.

18. The display device of claim 14, wherein the predetermined pattern is a ring-shaped pattern.

19. A display device, comprising:

a display area that comprises a plurality of pixels on a substrate and a touch electrode configured to sense a touch;

a first organic film on the substrate, the first organic film having a first portion located in the display area and a second portion located in a non-display area, an opening in the first organic film located between the first portion and the second portion of the first organic film; and first wiring to carry a signal to the display area, the first wiring extending over the second portion of the first organic film in the non-display area and also extending over the opening in the first organic film;

second wiring above the first wiring wherein the first wiring is physically connected with the second wiring in a bending region of the non-display area through the opening in the first organic film disposed between the first wiring and the second wiring in the bending area, wherein the first wiring carries a signal corresponding to the plurality of pixels where the first wiring extends from the non-display region including the bending region to the display area on the substrate, wherein the first wiring carries the signal for the touch electrode where the first wiring is not formed in the display area on the substrate.

20. The display device of claim 19, further comprising:
a second organic film on the first wiring; and
second wiring on the second organic film that is electrically connected to the first wiring in the non-display area.

21. The display device of claim 20, wherein the second wiring is electrically connected to the first wiring through holes in the second organic film.

\* \* \* \* \*